United States Patent
Bloomquist

(10) Patent No.: US 7,139,191 B1
(45) Date of Patent: Nov. 21, 2006

(54) MEMORY DEVICE AND METHOD OF USE

(75) Inventor: Darrel R. Bloomquist, deceased, late of Meridian, ID (US); by Judy Bloomquist, legal representative, Meridian, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/268,059

(22) Filed: Nov. 7, 2005

Related U.S. Application Data

(62) Division of application No. 10/355,788, filed on Jan. 31, 2003, now Pat. No. 6,982,901.

(51) Int. Cl.
*G11C 11/00* (2006.01)

(52) U.S. Cl. ...................... 365/158; 365/173

(58) Field of Classification Search ................ 365/158, 365/171, 173
See application file for complete search history.

(56) References Cited

U.S. PATENT DOCUMENTS

| | | | |
|---|---|---|---|
| 5,793,675 A * | 8/1998 | Cappelletti et al. | 365/185.09 |
| 6,388,927 B1 * | 5/2002 | Churchill et al. | 365/201 |
| 6,400,600 B1 * | 6/2002 | Nickel et al. | 365/171 |
| 6,456,525 B1 | 9/2002 | Perner et al. | |
| 2003/0098693 A1 * | 5/2003 | Enk | 324/537 |
| 2004/0126905 A1 * | 7/2004 | Bhattacharyya et al. | 438/3 |
| 2005/0190615 A1 * | 9/2005 | Linde et al. | 365/200 |

* cited by examiner

*Primary Examiner*—M. Tran

(57) ABSTRACT

A memory device includes a material layer associated with at least one memory cell. The material layer is alterable to change the electrical resistance of the memory cell.

15 Claims, 4 Drawing Sheets

MEMORY DEVICE AND METHOD OF USE

This application is a divisional of commonly assigned U.S. patent application Ser. No. 10/355,788, filed Jan. 31, 2003 now U.S. Pat. No. 6,982,901, to which priority is hereby claimed.

BACKGROUND OF THE INVENTION

One type of nonvolatile memory device known in the art relies on magnetic memory cells. Referred to as magnetic random access memory (MRAM) devices, these devices include an array of magnetic memory cells. The magnetic memory cells used in an MRAM device may be of several different types. For example, a tunneling magnetic junction (TMJ) memory cell or a giant magnetoresistive (GMR) memory cell.

A typical magnetic memory cell includes a layer of magnetic film in which the orientation of magnetization is alterable and a layer of magnetic film in which the orientation of magnetization is fixed or "pinned" in particular direction. The magnetic film having alterable orientation of magnetization may be referred to as a data storage layer and the magnetic film having an orientation of magnetization which is pinned may be referred to as a reference layer. The data storage layer and the reference layer are separated by a layer of insulating material.

In an MRAM device, conductive traces (commonly referred to as word lines and bit lines, or collectively as write lines) are routed in a matrix across a plurality of memory cells. Word lines extend along rows of the memory cell array, and bit lines extend along columns of the memory cell array. A memory cell is located at each intersection of a word line and a bit line.

Each memory cell stores a bit of information as an orientation of magnetization. Typically, the orientation of magnetization in the data storage layer aligns along an axis of the data storage layer that is commonly referred to as its easy axis. In a "parallel" orientation, the magnetic fields of the data storage layer and reference layer point in the same direction. In an "anti-parallel" orientation, the magnetic fields of the data storage layer and reference layer point in opposite directions. External magnetic fields are applied to flip the orientation of magnetization in the data storage layer along its easy axis to either a parallel or anti-parallel orientation with respect to the orientation of magnetization in the reference layer, depending on the desired logic state. The orientation of magnetization of each memory cell will thus assume one of two stable orientations at any given time. These two stable orientations parallel and anti-parallel, represent logic values of "1" and "0", respectively.

The orientation of magnetization of a selected memory cell may be changed by supplying currents to the word line and bit line intersecting at the selected memory cell. The currents in the word and bit lines create magnetic fields that, when combined, switch the orientation of magnetization of the selected memory cell from parallel to anti-parallel or vice versa. Additionally, the write lines can be used to read the logic values stored in the memory cell.

One problem which exists for MRAM devices using magnetic memory cells like those described above is the occasional presence of a defective memory cell. In particular, the insulating-layer of a memory cell may include defects which cause the nominal resistance of the affected memory cell to drop several orders of magnitude lower than the resistance of a properly functioning memory cell. The insulating layer is typically the only non-conductive material in the memory cell stack. Thus, defects such as foreign conductive material particles in the insulating layer, pin holes through the insulating layer, or a too-thin insulating layer resulting from poor material deposition processes during the formation of the memory cell, may result in a memory cell resistance which is unacceptably low.

Because data in a memory cell is written and read by passing electrical currents through the write lines that intersect the memory cell, a memory cell having a nominal resistance which differs substantially from the resistance of a properly functioning memory cell will affect the currents (and thus magnetic fields) intended to write or read data in the memory cell. The low resistance memory cell is effectively rendered unusable. In addition, in the absence of switches or diodes to isolate one memory cell from another, the low resistance memory cell appears essentially as a short circuit between the word and bit lines which intersect at the defective memory cell. As a result, all other memory cells along the word and bit line of the defective memory cell are also affected and possibly rendered unusable. This can have a significant negative impact on the storage capacity of the memory array.

Currently, in the absence of switches or diodes to isolate one memory cell from another, there is no effective way to repair a defective memory cell exhibiting low nominal resistance, or limit its detrimental effects on other memory cells sharing a common word and/or bit line in the memory array. Although switches or diodes may be added to an MRAM device to isolate one memory cell from another, such a process adds cost and complexity to the device.

SUMMARY OF THE INVENTION

A memory device which limits or eliminates the detrimental effects of a low nominal resistance memory cell on an array of memory cells in an MRAM device is described herein. One embodiment of a memory device according to the invention includes a material layer associated with at least one memory cell. The material layer is alterable to change the electrical resistance of the memory cell.

DETAILED DESCRIPTION

In the following detailed description, reference is made to the accompanying drawings which form a part hereof, and in which is shown by way of illustration specific embodiments in which the invention may be practiced.

Figure 1A:
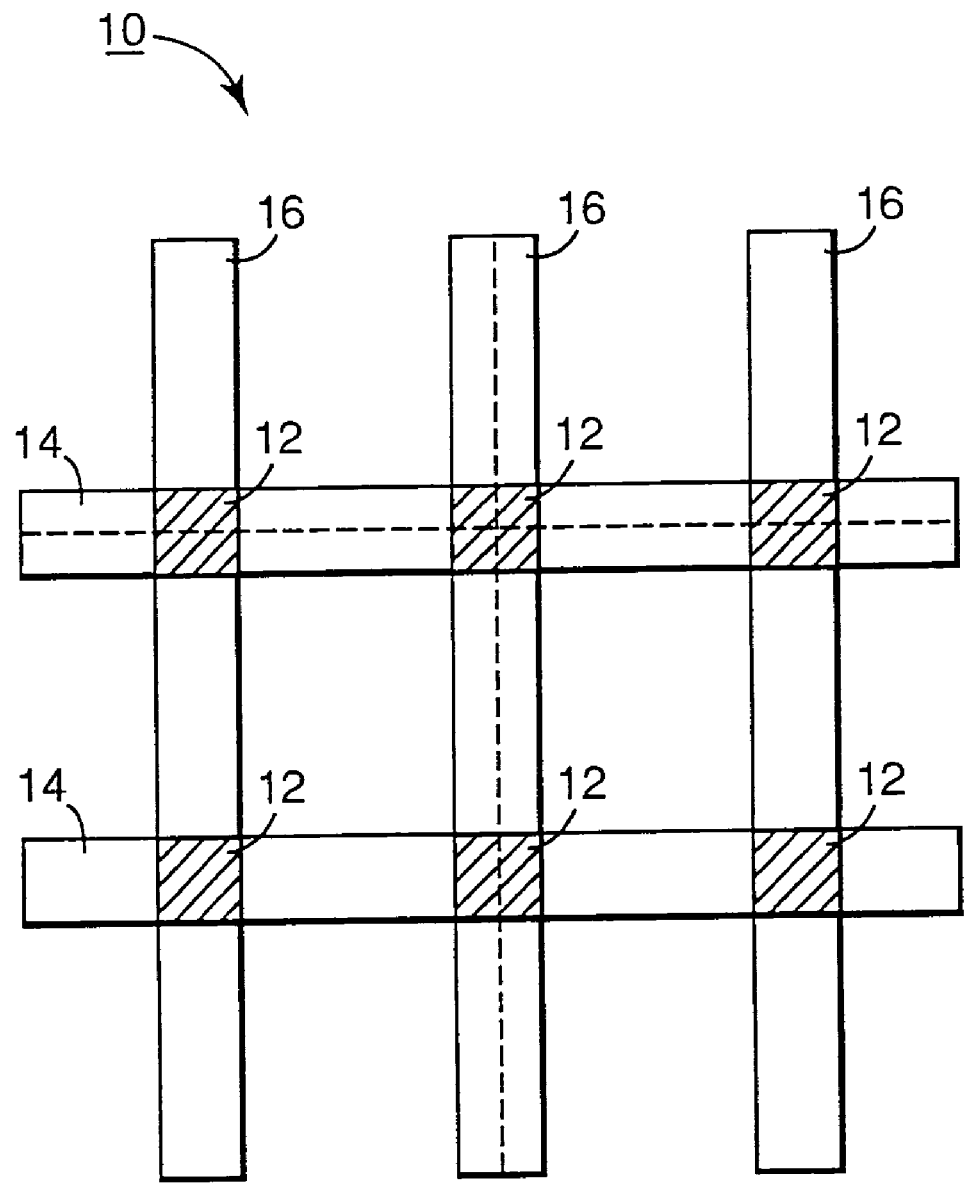
FIGS. 1a and 1b are top and perspective views, respectively, of a prior art magnetic random access memory array.
Figure 1B:
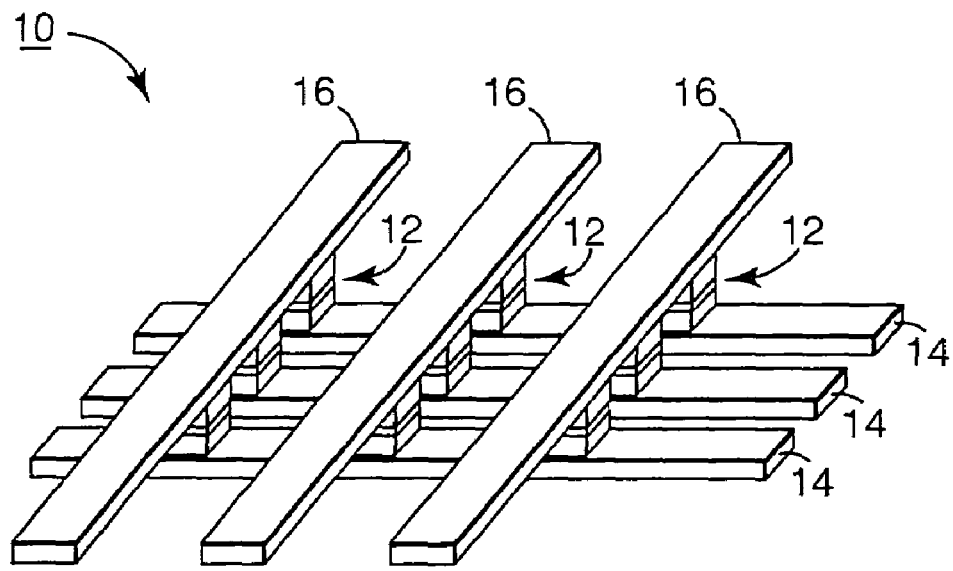

FIGS. 1a and 1b illustrate a simplified prior art MRAM array 10. The array 10 includes memory cells 19, word lines 14, and bit lines 16. Word lines 14 and bit lines 16 are collectively referred to herein as write lines. The memory cells 12 are positioned at each intersection of a word line 14 with a bit line 16, and are positioned between the write lines 14, 16, as more clearly seen in FIG. 1b.

Figure 2:
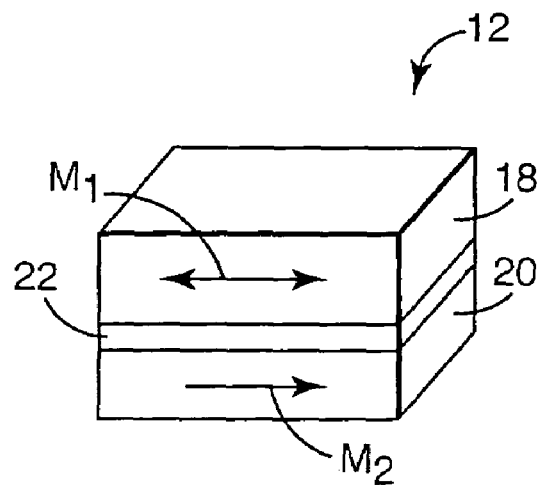
FIG. 2 is perspective view of a prior art magnetic random access memory cell illustrating the orientations of magnetization of data storage and reference magnetic film layers.

FIG. 2 illustrates a single memory cell 12 from FIGS. 1a and 1b, and shows how a bit of data is stored in the memory cell 12. As can be seen in FIG. 2, the memory cell 12 includes a data storage layer 18 having an alterable orientation of magnetization $M_1$ which can assume either of two stable orientations, and a reference layer 20 having a fixed or pinned orientation of magnetization $M_2$. The data storage layer 18 and reference layer 20 are separated by an insulating layer 22. The data storage layer 18 rotates its orientation of magnetization $M_1$ in response to electrical currents applied to the write lines 14, 16 (not shown in FIG. 2) during a write operation to the memory cell 12.

A first logic state stored in memory cell 12 is indicated when the orientations of magnetization $M_1$ and $M_2$ are parallel to each other. For instance, when orientations of magnetization $M_1$ and $M_2$ are parallel a logic "1" state is stored in the memory cell 12. A second logic state is indicated when orientations of magnetization $M_1$ and $M_2$ are anti-parallel to each other. Thus, when orientations of magnetization $M_1$ and $M_2$ are anti-parallel a logic "0" state is stored in the memory cell 12. It should be noted that although FIG. 2 illustrates the data storage layer 18 positioned above the reference layer 20, the reference layer 20 can alternately be positioned above the data storage layer 18.

The resistance of the memory cell 12 differs according to the relative orientations of $M_1$ and $M_2$. When orientations of magnetization $M_1$ and $M_2$ are anti-parallel, i.e., the logic "0" state, the resistance of the memory cell 12 is at its highest. On the other hand, the resistance of the memory cell 12 is at its lowest when the orientations of magnetization $M_1$ and $M_2$ are parallel, i.e., the logic "1" state. As a consequence of the differing resistances of the parallel and anti-parallel states, the logic state of the data bit stored in the memory cell 12 can be determined by measuring its resistance. The resistance of the memory cell 12 may be measured using write lines 14, 16.

As described above, it is important that each memory cell 12 in an MRAM device have a nominal resistance that is close to the design value of a properly functioning memory cell. A memory cell 12 having a nominal resistance that is sufficiently lower than the design value, such that the logic state of the memory cell 12 is impossible to determine, is referred to herein as a defective memory cell 12. The difference in resistance between a memory cell's parallel and anti-parallel states is relatively small, so when a memory cell 12 has a nominal resistance lower than the design value, it becomes very difficult or impossible to accurately determine the logic state of the memory cell 12. In addition, in the absence of switches or diodes to isolate one memory cell 12 from another in an MRAM device, a defective memory cell 12 will also render unusable all other memory cells 12 which share a common word line 14 or bit line 16 with the defective memory cell 12.

As noted above, a defective memory cell 12 may result from defects in the insulating layer 22 of a memory cell 12. The nominal resistance of a memory cell 12 may drop lower than the resistance of a properly functioning memory cell and result in a defective memory cell, for example, if insulating layer 22 is too thin, or is contaminated with conductive material particles, or has pinholes through the insulating layer 22. It is contemplated that individuals skilled in the art will recognize additional situations or circumstances which could result in a reduction in the resistance across insulating layer 22 and thus result in a defective memory cell 12. No matter what the cause of a resistance reducing defect in a memory cell 12, it is desirable to eliminate or reduce the detrimental effects of the defective memory cell 12 on other memory cells 12 in the MRAM device.

Figure 3:
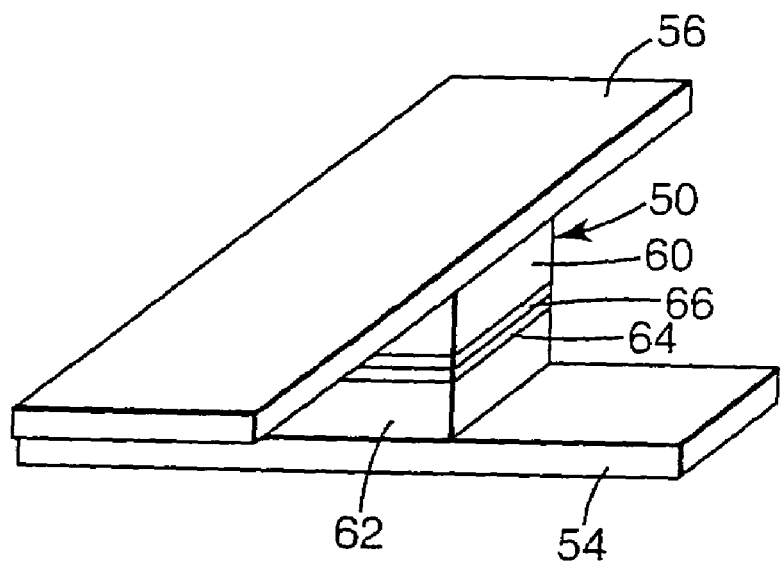
FIG. 3 is a perspective view of one embodiment of a magnetic memory cell in a magnetic random access memory array according to the invention.

FIG. 3 illustrates one embodiment of a single memory cell 50 of an MRAM device according to the present invention. In practice, the single memory cell 50 is only one of a plurality of memory cells in an array of similar memory cells. Memory cell 50 may be formed using known semiconductor fabrication and magnetic film processing techniques including material deposition techniques, photolithography, masking and etching.

Memory cell 50 includes a data storage layer 60, a reference layer 62, and an insulating layer 64 which acts as a tunnel barrier between the data storage layer 60 and the reference layer 62. The data storage layer 60 and reference layer 62 may be formed from ferromagnetic materials such as, for example, nickel iron (NiFe), or iron oxide ($Fe_3O_4$), or chromium oxide ($CrO_2$), or cobalt alloys (e.g., CoFe or NiCoFe), or other suitable ferromagnetic materials and alloys known to individuals skilled in the art. Insulating layer 64 may be formed from, for example, a material such as aluminum oxide ($Al_2O_3$), silicon dioxide ($SiO_2$), tantalum oxide ($Ta_2O_5$), silicon nitride ($SiN_4$), or other suitable dielectric materials known to those individuals skilled in the art.

The above-described structure of a magnetic memory cell 50 may be referred to as a spin-tunneling device, in that an electrical charge migrates through the insulating layer 64 during read operations. This electrical charge migration through the tunnel barrier is due to a phenomenon known as spin-tunneling and occurs when a read voltage is applied across the magnetic memory cell 50. A spin-tunneling device is one type of giant magneto-resistive (GMR) structure. In alternate embodiments according to the invention, the memory cell may be any type of giant magneto-resistive (GMR) structure.

Memory cell 50 also includes an intermediate layer 66 positioned between data storage layer 60 and reference layer 62. Intermediate layer 66 is alterable to change the resistance of memory cell 50. In one embodiment according to the invention, intermediate layer 66 is formed of a material which is alterable to cause the memory cell 50 to act as an open circuit if an excess electrical current (i.e. an electrical current which exceeds a predetermined threshold current) is driven through the memory cell 50 via write lines 54, 56. The material of intermediate layer 66 may be, for example, a fusible material such as nichrome, polysilicon, or titanium-tungsten which is melted by the excess electrical current to cause an open circuit in the defective memory cell 50.

In an alternate embodiment according to the invention, intermediate layer 66 is altered to increase the resistance of intermediate layer 66 to a level on the same order of magnitude as a properly-functioning memory cell. Possible mechanisms for increasing the resistance of intermediate layer 66 include using the excess current to move ions into holes in the intermediate layer 66 and thereby increase its electrical resistance. Other mechanisms include forming intermediate layer 66 of a phase-change material which undergoes a change in resistance as it changes phases.

In yet another embodiment according to the invention, memory cell 50 may not include a separate and distinct intermediate layer 66 having an alterable resistance, as shown in FIG. 3. Rather, one or more of the other layers of the memory cell 50 may also serve the function of providing an alterable resistance. For example, the material of insulating layer 64 may have an alterable resistance, such that a current or current spike exceeding the threshold current causes the memory cell 50 to act as an open circuit.

Figure 4:
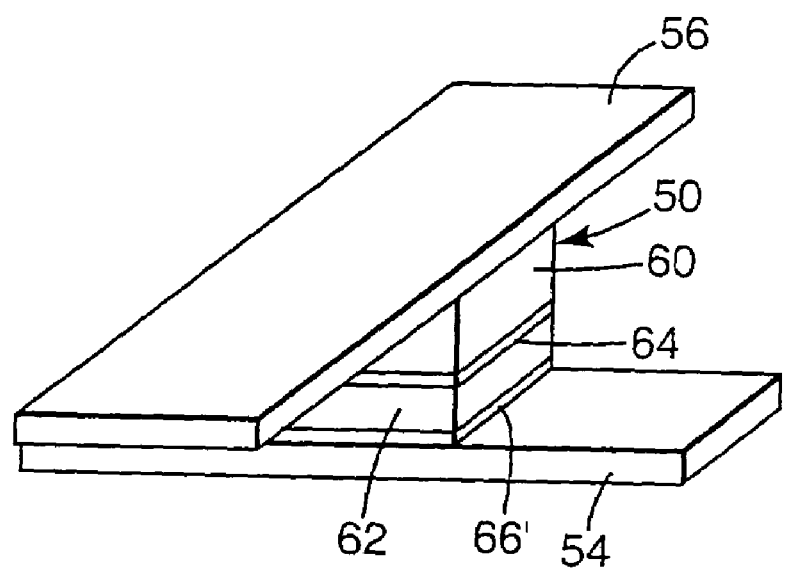
FIG. 4 is a perspective view of another embodiment of a magnetic memory cell in a magnetic random access memory array according to the invention.

Another embodiment according to the invention is shown in FIG. 4. In the embodiment of FIG. 4, layer 66' having an alterable resistance is positioned between write line 54 and reference layer 62 of memory cell 50. Layer 66' may alternately be positioned between write line 56 and data storage layer 60. In other respects, layer 66' is similar to intermediate layer 66 described above. In particular, layer 66' is formed of a material which is alterable to cause the memory cell 50 to act as an open circuit if an excess electrical current (i.e., an electrical current which exceeds a predetermined threshold current) is driven through the memory cell 50 via write lines 54, 56. The material of layer 66' may be, for example, a fusible material such as nichrome polysilicon or titanium-tungsten which is melted by the excess electrical current to cause an open circuit in the defective memory cell 50.

In yet another embodiment according to the invention, layer 66' is altered to increase the resistance of layer 66' to a level on the same order of magnitude as a properly-functioning memory cell. Possible mechanisms for increasing the resistance of layer 66' include using the excess current to move ions into holes in the layer 66' and thereby increase its electrical resistance. Other mechanisms include forming layer 66' of a phase change material which undergoes a change in resistance as it changes phases.

Figure 5:
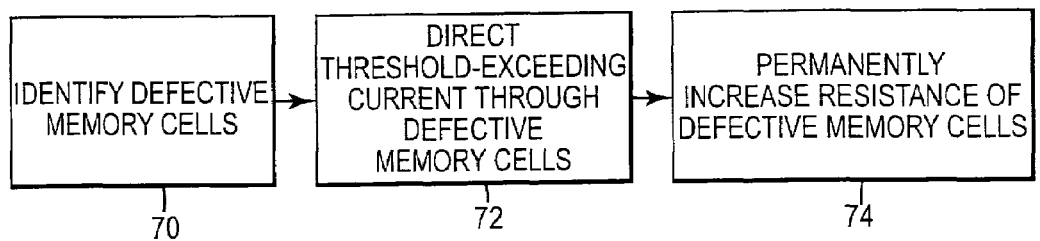
FIG. 5 is a block diagram illustrating a method for repairing a magnetic random access memory array according to the invention.

Using any of the above-described embodiments according to the invention, a magnetic random access memory array having a defective memory cell 50 is repairable. As illustrated in FIG. 5, when a memory cell 50 is identified as having a low nominal resistance (i.e., the memory cell 50 is identified as defective) (step 70), a current or current spike exceeding the predetermined threshold current is directed through the defective memory cell 50 (step 72). The layers 66, 66' having alterable resistance are altered by the current or current spike (step 74) to permanently increase the resistance of memory cell 50 by an amount sufficient to cause the defective memory cell 50 to approximate an open circuit in the MRAM array, such as by fusing the layer 66. 66'. Alternately, the resistance of the defective memory cell 50 is permanently increased to a level on the same order of magnitude as a properly-functioning memory cell and thereby approximates a properly-functioning memory cell in the MRAM array. An electrical current or current spike which is less than the threshold current does not result in an increase in electrical resistance across the memory cell 50.

A non-functioning memory cell 50 acting as an open circuit or having a resistance on the same order of magnitude as a properly-functioning memory cell is less destructive to the MRAM device than a memory cell behaving as a short circuit, in that a memory cell 50 repaired in this manner does not affect all other memory cells 50 along the common word line 54 and bit line 56. The detrimental effects of a low nominal resistance memory cell 50 are thus limited, and MRAM device is effectively repaired by restoring the functionality of other memory cells 50 along the common write lines 54, 56, of the defective memory cell 50.

What is claimed is:

1. A magnetic random access memory array comprising:
   a plurality of memory cells; and
   at least one defective memory cell including a material layer between a data storage layer and reference layer, wherein the defective memory cell is repairable by directing a threshold exceeding current through the defective memory cell, the material layer being permanently altered by the threshold exceeding current, wherein the threshold exceeding current fuses the material layer.

2. A magnetic random access memory array comprising:
   a plurality of memory cells; and
   at least one defective memory cell, wherein the defective memory is repairable by directing a threshold exceeding current through the defective memory cell, wherein the threshold exceeding current alters the resistance of the defective memory cell and permanently increases the resistance of the defective memory cell to cause the defective memory cell to approximate an open circuit.

3. A magnetic random access memory array comprising:
   a plurality of memory cells; and
   at least one defective memory cell, wherein the defective memory is repairable by directing a threshold exceeding current through the defective memory cell, wherein the threshold exceeding current alters the resistance of the defective memory cell and permanently changes the resistance of the defective memory cell to cause the defective memory cell to approximate a properly-functioning memory cell.

4. A memory device comprising:
   a plurality of memory cells, each of the plurality of memory cells including a material layer having alterable electrical resistance; and
   at least one defective memory cell in the plurality of memory cells, wherein the defective memory cell causes reduced functionality of other memory cells in the plurality of memory cells;
   wherein the memory cells having reduced functionality are restorable to full functionality by altering the resistance of the material layer in the defective memory cell.

5. The memory device of claim 4, wherein the electrical resistance of the material layer, once altered, increases.

6. The memory device of claim 4, wherein the material layer having alterable electrical resistance is a permanently alterable material.

7. The memory device of claim 6, wherein the material layer having alterable electrical resistance is a fusible material.

8. The memory device of claim 7, wherein the fusible material is selected from the group consisting of nichrome, polysilicon, and titanium-tungsten.

9. The memory device of claim 4, wherein the defective memory cell shares a common write conductor with the memory cells having reduced functionality.

10. The memory device of claim 4, wherein the material layer having alterable electrical resistance is positioned within the associated memory cell.

11. A method for improving functionality of a plurality of reduced functionality memory cells in an array of memory cells, the method comprising:
    identifying a defective memory cell in an array of memory cells, wherein the defective memory cell causes reduced functionality of a plurality of memory cells in the array of memory cells; and
    permanently altering the electrical resistance of the defective memory cell to improve functionality of the plurality of reduced functionality memory cells.

12. The method of claim 11, wherein permanently altering the electrical resistance of the defective memory cell comprises permanently increasing the electrical resistance of the defective memory cell.

13. The method of claim 12, wherein permanently increasing the electrical resistance of the defective memory cell comprises increasing the electrical resistance until the defective memory cell approximates an open circuit.

14. The method of claim 12, wherein permanently increasing the electrical resistance of the defective memory cell comprises increasing the electrical resistance until the resistance is the same order of magnitude as the resistance of a properly functioning memory cell.

15. The method of claim 11, wherein permanently altering the electrical resistance of the defective memory cell comprises directing a threshold exceeding current through the defective memory cell.

* * * * *